(12) United States Patent
Yokota

(10) Patent No.: US 7,215,132 B2
(45) Date of Patent: May 8, 2007

(54) INTEGRATED CIRCUIT AND CIRCUIT BOARD

(75) Inventor: Tetsuya Yokota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/212,358

(22) Filed: Aug. 26, 2005

(65) Prior Publication Data

US 2007/0001705 A1   Jan. 4, 2007

(30) Foreign Application Priority Data

Jun. 30, 2005   (JP) .............................. 2005-191513

(51) Int. Cl.
*G01R 31/02* (2006.01)

(52) U.S. Cl. ...................... 324/763; 324/765; 714/733

(58) Field of Classification Search ................ 324/763, 324/765; 714/733
See application file for complete search history.

(56) References Cited

U.S. PATENT DOCUMENTS

| | | | | |
|---|---|---|---|---|
| 5,072,175 A | * | 12/1991 | Marek | 324/73.1 |
| 5,414,351 A | * | 5/1995 | Hsu et al. | 324/756 |
| 5,453,991 A | * | 9/1995 | Suzuki et al. | 714/724 |
| 5,565,766 A | * | 10/1996 | Kuwahara et al. | 324/158.1 |
| 5,724,502 A | * | 3/1998 | Cherichetti et al. | 714/28 |
| 5,745,500 A | * | 4/1998 | Damarla et al. | 714/732 |
| 5,764,952 A | * | 6/1998 | Hill | 716/4 |
| 6,522,160 B1 | * | 2/2003 | Zivanovic | 324/765 |
| 6,651,202 B1 | * | 11/2003 | Phan | 714/733 |

FOREIGN PATENT DOCUMENTS

| | | |
|---|---|---|
| JP | 11064465 | 3/1999 |
| JP | 2002206199 | 7/2000 |

\* cited by examiner

*Primary Examiner*—Jermele Hollington
*Assistant Examiner*—Arleen M. Vazquez
(74) *Attorney, Agent, or Firm*—Greer, Burns & Crain, Ltd.

(57) ABSTRACT

In an integrated circuit implemented on a circuit board, output lines of an output circuit that outputs a logic signal are connected to the circuit board by soldering of a leadless terminal that cannot be seen as being implemented. A fault diagnosing unit tests an output voltage of the leadless terminal with respect to the circuit board as being implemented to determine whether the output voltage is a normal voltage or an abnormal voltage. The fault diagnosing unit includes a pseudo-output unit that applies a pseudo-set predetermined pseudo-output voltage to the leadless terminal, a first switching unit that cuts a connection of the output terminal to the leadless terminal at the time of fault diagnosis, a second switching unit that supplies a pseudo-output voltage of the pseudo-output unit to the leadless terminal side as being cut, a measuring unit that measures a voltage of the leadless terminal in a fault diagnosis state resulting from diagnosis switching, and a determining unit that determines from the measured voltage whether a voltage of the leadless terminal is a normal voltage or an abnormal voltage.

15 Claims, 12 Drawing Sheets

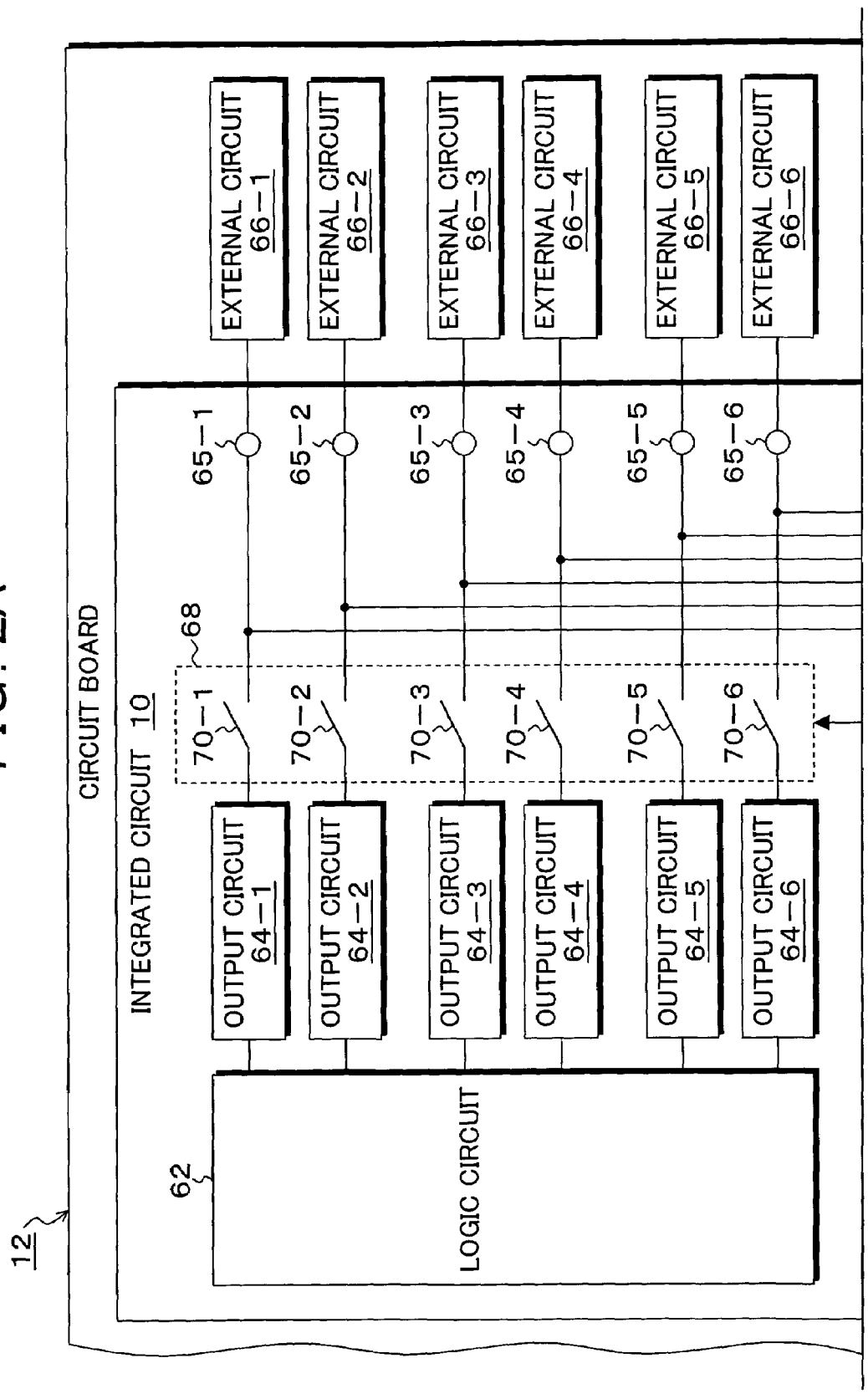

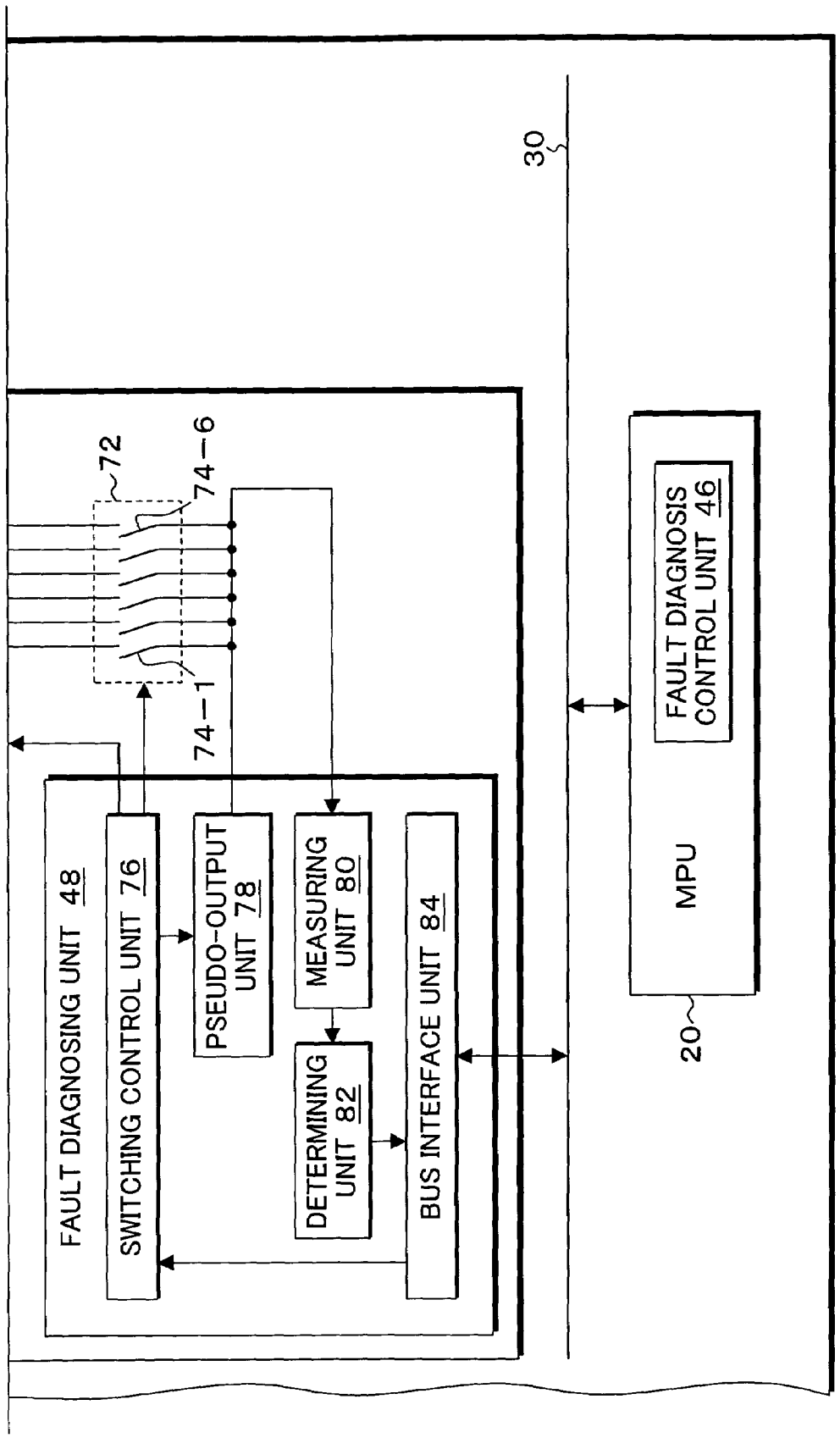

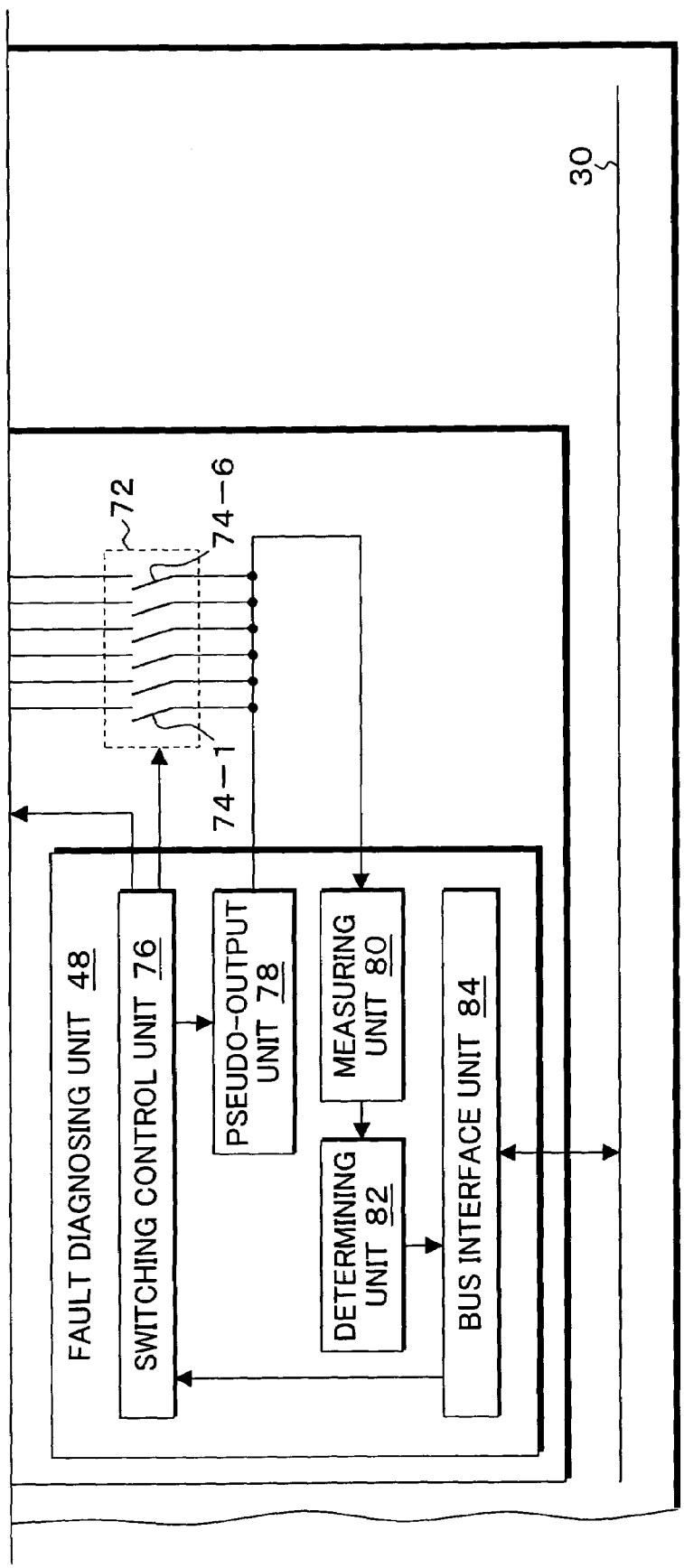

INTEGRATED CIRCUIT AND CIRCUIT BOARD

This application is a priority based on prior application No. JP 2005-191513, filed Jun. 30, 2005, in Japan.

BACKGROUND OF THE INVENTION

1. Field of the Invention

The present invention relates to an integrated circuit implemented on a circuit board by a soldering connection of a leadless terminals, and the circuit board, and particularly to an integrated circuit and a circuit board that perform self-diagnosis of a fault of a leadless terminal.

2. Description of the Related Arts

Conventionally, in order to achieve demands for downsizing of equipment, such as information apparatuses, and also to achieve high-speed signal transmission, downsizing of components and high-density implementation have been pursued. To achieve such high-density implementation, an ingeniously-devised configuration is used in a package of an integrated circuit. Conventionally, as a leadless package structure suitable for high-density implementation of an integrated circuit, a ball grid array has been known. The ball grid array, commonly called BGA, is a package in which leadless terminals configured by soldering balls are disposed in a lattice shape at regular spacing on the back surface of a package having contact with a printed circuit board, wherein the leadless terminals are soldered to the pattern of the corresponding printed circuit board. The leadless terminals are on the back side of the package in a narrow space between the package and the printed circuit board. Therefore, solder paste for binding is applied in advance to the pattern of the printed circuit board through a printing process, and the entire package is then heated to melt the solder for binding attached to a terminal portion, thereby achieving soldering.

[Patent Document 1] Japanese Patent Laid-Open Publication No. 11-64465

[Patent Document 2] Japanese Patent Laid-Open Publication No. 2000-206199

In a circuit arrangement having implemented thereon an integrated circuit using a ball grid array as a package structure, an unaccounted fault occurs at a high frequency. To track down a cause of such a fault, a method is generally taken such that, with full knowledge of operations at a level of a large-scale apparatus using the circuit arrangement, a malfunction portion is estimated based on various phenomena, measurement data, etc., and then portions that might have caused the fault are narrowed down by a check through direct-current characteristic measurement. However, such tracking down involves many difficulties in skills in trouble diagnosis and the number of processes, and therefore is not easy. To track down such a malfunction portion, it is required to see the state of the leadless terminals on the back side of the package for use in the integrated circuit. However, the terminal portions are hidden on the back side of the package, making it difficult to detect, through a visual inspection, an abnormality, poor connection, short-circuit trouble due to attachment of a foreign matter, and others in the soldering portion. Furthermore, it is often difficult to connect a jig of a measuring device to the leadless terminal or the printed circuit board pattern of a connection destination so as to determine a characteristic abnormality inside the integrated circuit. This poses a problem in specifying a troubled portion in various tests.

SUMMARY OF THE INVENTION

According to the present invention, the purpose is to provide an integrated circuit and a circuit board allowing a diagnosis of a fault resulting from the state of a terminal in an integrated circuit having a package structure soldered to a circuit board with leadless terminals that cannot be seen or are hard to be seen from outside as being implemented.

The present invention provides an integrated circuit. The integrated circuit according to the present invention includes: an output circuit that outputs a logic signal; a leadless terminal connecting an output line of the output circuit, being connected by soldering to a circuit board, and being not able to be seen as being implemented; and a fault diagnosing unit that tests an output voltage of the leadless terminal as being implemented on the circuit board to determine whether the output voltage is a normal voltage or an abnormal voltage.

Here, the fault diagnosing unit includes: a pseudo-output unit that applies a pseudo-set predetermined pseudo-output voltage to the leadless terminal; a switching unit (first switching unit and second switching unit) that cuts a connection of the output circuit to the leadless terminal at the time of fault diagnosis, and supplies the pseudo-output voltage of the pseudo-output unit to the leadless terminal side as being cut; a measuring unit that measures a voltage of the leadless terminal in a fault diagnosis state by the switching unit; and a determining unit that determines, from the voltage measured by the measuring unit, whether the voltage of the leadless terminal is a normal voltage or an abnormal voltage.

In the integrated circuit of the present invention, when a plurality of the output circuits are present, the switching unit sequentially cuts connections of leadless terminals with the plurality of output circuits at the time of fault diagnosis and, in synchronization with the cutting of the leadless terminal, connects an output of the pseudo-output unit to a relevant one of the leadless terminals.

The switching unit includes a first switching unit that cuts an output of the output circuit from the leadless terminal at the time of the fault diagnosis and a second switching unit that connects the output of the pseudo-output unit to the leadless terminal side cut by the first switching unit.

The pseudo-output unit outputs a resistance divided voltage generated by a resistance series circuit as the pseudo-output voltage.

With an external circuit of the circuit board making a pull-up connection of an input line to a power source line via a pull-up resistor, when the measured voltage is in a predetermined voltage range centering on a specific voltage defined by a resistance of the pseudo-output unit and the pull-up resistor, the determining unit determines that the measured voltage is a normal voltage, and when the measured voltage is outside the predetermined voltage range, determines that the measured voltage is an abnormal voltage resulting from a soldering trouble of the leadless terminal.

With an external circuit of the circuit board making a pull-down connection of an input line to a ground via a pull-down resistor, when the measured voltage is in a predetermined voltage range centering on a specific voltage defined by a resistance of the pseudo-output unit and the pull-down resistor, the determining unit determines that the measured voltage is a normal voltage, and when the measured voltage is outside the predetermined voltage range, determines that the measured voltage is an abnormal voltage resulting from a soldering trouble of the leadless terminal.

With an external circuit of the circuit board being in a floating state in which an input line is cut from a power source line and a ground, when the measured voltage is in a predetermined voltage range centering on a specific voltage defined by a divided voltage resistance of the pseudo-output unit, the determining unit determines that the measured voltage is a normal voltage, and when the measured voltage is outside the predetermined voltage range, determines that the measured voltage is an abnormal voltage resulting from a soldering trouble of the leadless terminal.

The pseudo-output unit is provided to divide external circuits on the circuit board into groups corresponding to a connection of a pull-up resistor, a connection of a pull-down resistor, or floating without a connection of the pull-up resistor or the pull-down resistor and output a pseudo-output voltage unique to each group.

The output circuit includes an input/output circuit. The fault diagnosing unit performs fault diagnosis upon receipt from a processor incorporated in the integrated circuit or implemented on the circuit board and responds with the diagnosis result.

A circuit board having implemented thereon an integrated circuit and a circuit external thereto, the circuit board including: an output circuit that outputs a logic signal; a leadless terminal connecting an output line of the output circuit and being connected by soldering to a circuit board; and a fault diagnosing unit that tests an output voltage of the leadless terminal as being implemented on the circuit board to determine whether the output voltage is a normal voltage or an abnormal voltage.

According to the present invention, even if a soldering portion between a leadless terminal and a pattern of a circuit board cannot be seen with the circuit board having implemented thereon an integrated circuit, upon an instruction for fault diagnosis from a processor implemented on or included in the circuit board to the integrated circuit, a predetermined output of a pseudo-output unit is applied to the leadless terminal side, with an output circuit being cut from the leadless terminal, to measure a terminal voltage. From the measurement voltage, it is determined whether the leadless terminal has a normal voltage or an abnormal voltage, thereby allowing easy diagnosis of the state of soldering of the leadless terminal.

Abnormalities that can be detected from this fault diagnosis are as follows.

(1) An increase in leak current or short-circuit trouble caused by a foreign matter or the like being attached between a leadless terminal of the integrated circuit and a ground pattern, power-source pattern, or another signal line of low impedance of the circuit board.

(2) An increase in leak current or short-circuit trouble caused at a portion to which a leadless terminal is connected inside the integrated circuit. Thus, when a malfunction occurs in equipment or apparatus having incorporated therein a circuit board having implemented thereon an integrated circuit including a fault diagnosing unit according to the present invention, an integrated-circuit fault diagnosis according to the present invention is performed, thereby easily tracking down the present or absent of a fault resulting from the state of soldering of a leadless terminal that cannot be seen from outside. Also, with the integrated-circuit fault diagnosis according to the present invention being included in a product inspecting process, a malfunction can be resolved in a stage prior to product shipping, thereby improving yields and reliability of the product. The above and other objects, features, and advantages of the present invention will become more apparent from the following detailed description with reference to the drawings.

BRIEF DESCRIPTION OF THE DRAWINGS

FIGS. 2A and 2B are block diagrams showing a fault diagnosing unit according to the present invention provided on the integrated circuit of FIGS. 1A and 1B together with external circuits on a circuit board;

FIGS. 9A and 9B are circuit block diagrams showing a fault diagnosing unit according to still another embodiment of the present invention that is applied to input/output circuits.

DETAILED DESCRIPTION OF THE PREFERRED EMBODIMENTS

Figure 1A:
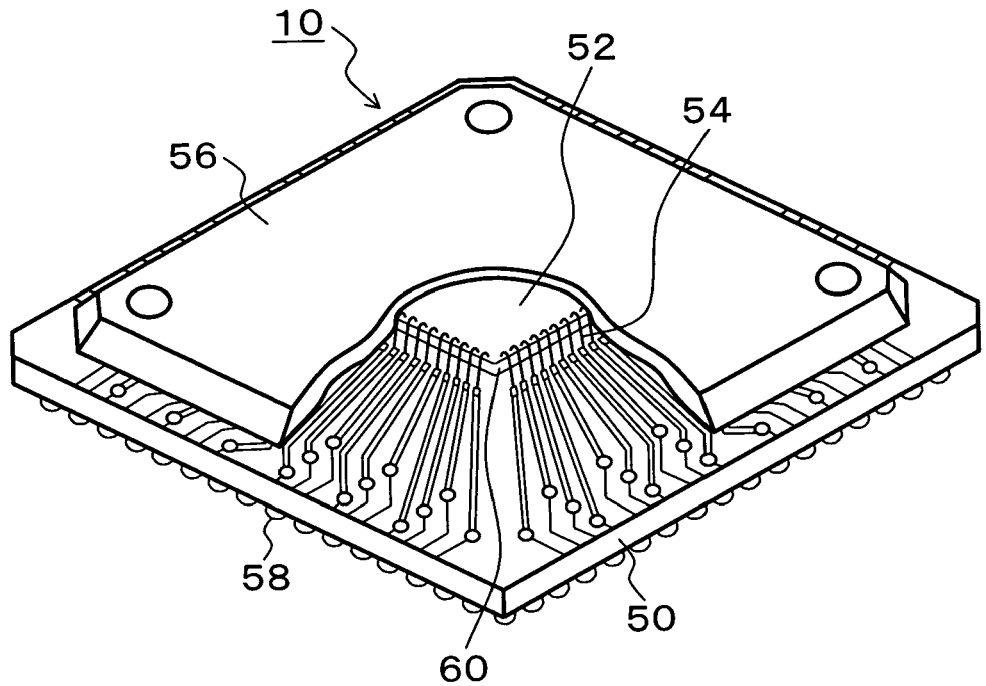
FIGS. 1A and 1B are drawings for describing an integrated circuit according to the present invention with a package structure using a ball grid array.
Figure 1B:
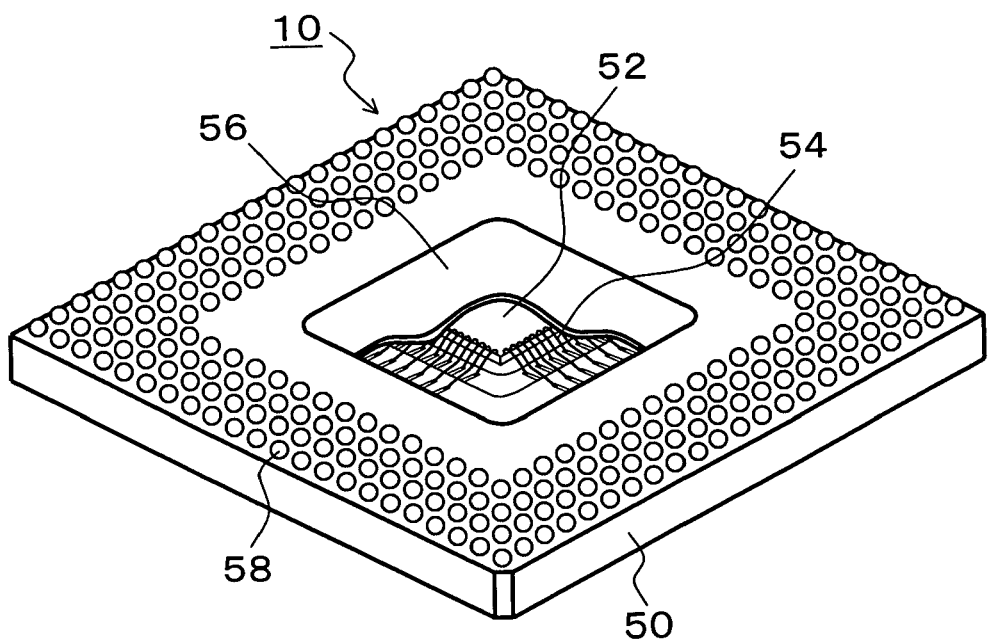

FIGS. 1A and 1B are drawings for describing a package structure of an integrated circuit using a ball grid array according to the present invention. FIG. 1A is a perspective view of the front side of an integrated circuit 10, wherein a chip 52 is disposed on a multilayer printed circuit board 50, and the terminal side of the multilayer printed circuit board 50 and the chip 52 are connected to each other with Au wires 54 with their top being sealed by resin 56. As shown in FIG. 1B, which is a drawing for describing the back side, soldering balls 58 are disposed in a lattice shape. The integrated circuit 10 having the above-described structure is positioned by applying solder paste for bonding through a printing process to the pattern of a circuit board having implemented thereon the integrated circuit 10 and then heating the entire package, thereby melting the soldering balls 58 for soldering. Therefore, with the integrated circuit 10 being implemented on the circuit board through soldering, the state of soldering by the soldering balls 58 with the pattern at the back side cannot be seen from outside.

FIGS. 2A and 2B are circuit block diagrams with the integrated circuit 10 of FIGS. 1A and 1B being implemented through soldering on the circuit board 12. In FIGS. 2A and 2B, the integrated circuit 10 using the ball-grid-array package includes a fault diagnosing unit 48 for performing fault diagnosis of leadless terminals connected to the pattern by soldering balls. The fault diagnosing unit 48 tests an output voltage of a leadless terminal fixed by soldering with soldering balls, with the integrated circuit 10 being implemented on the circuit board 12, to determine whether the output voltage is a normal voltage or an abnormal voltage. Correspondingly to the fault diagnosing unit 48 of the integrated circuit 10, an MPU 20 implemented on the circuit board 12 includes a fault diagnosis control unit 46. In a diagnosis process by the fault diagnosing unit 48 of the integrated circuit 10, when a device using the circuit board 12 is connected to testing equipment for test processing in the stage where assembly in the manufacturing line has been completed, a fault diagnosis process is simultaneously performed. The testing equipment having connected thereto the device allows a testing program to be downloaded to, for example, memory of the MPU 20. The MPU 20 executes the testing program downloaded to its memory to perform a necessary testing process. The testing program downloaded from the testing equipment includes a fault diagnosis program according to the present invention. By executing the fault diagnosis program, the function of the fault diagnosis control unit 46 of the MPU 20 is achieved. That is, the MPU 20 executes the fault diagnosis program downloaded from the testing equipment to achieve the function of the fault diagnosis control unit 46, instructs via a bus 30 the fault diagnosing unit 48 included in the integrated circuit 10 to perform fault diagnosis for diagnosing the state of soldering of the leadless terminals, receives the diagnosis results obtained through a fault diagnosing operation of the fault diagnosing unit 48, and then notifies the results to the testing equipment. Inside the integrated circuit 10, a logic circuit 62 is provided. The logic circuit 62 is connected to output circuits 64-1 to 64-6 for outputting a logic signal according to a logic level of H or L. Output lines from the output circuits 64-1 to 64-6 are connected to external circuits 66-1 to 66-6 by a circuit pattern via leadless terminals 65-1 to 65-6 connected to the pattern on the circuit board 12 by the soldering balls 58 shown in FIGS. 1A and 1B. A circuit portion including the leadless terminals 65-1 to 65-6 at output side on the integrated circuit 10 described above is provided with the fault diagnosing unit 48 of the present invention. The fault diagnosing unit 48 of the present invention includes a first switching unit 68, a second switching unit 72, a switching control unit 76, a pseudo-output unit 78, a measuring unit 80, a determining unit 82, and a bus interface unit 84. When the switching control unit 76 receives a fault diagnosis instruction from the MPU 20 via the bus interface unit 84, the first switching unit 68 cuts the output circuits 64-1 to 64-6 from the corresponding leadless terminals 65-1 to 65-6, respectively. That is, the first switching unit 68 includes switches 70-1 to 70-6. At the normal state, the switches 70-1 to 70-6 are closed in an ON state to connect outputs of the output circuits 64-1 to 64-6 to the leadless terminals 65-1 and 65-6. Upon reception of a fault diagnosis instruction from the MPU 20, the switches 70-1 to 70-6 are sequentially switched with a switch control signal from the switching control unit 76 in the order of the switches 70-1 to 70-6 from an ON state to an OFF state, thereby sequentially cutting the connection of the output circuits 64-1 to 64-6 to leadless terminals 65-1 and 65-6. The second switching unit 72 includes switches 74-1 to 74-6 to connect an output of the pseudo-output unit 78 to the leadless terminals 65-1 to 65-6 side. The second switching unit 72 performs switching control in synchronization with the first switching unit 68. That is, in synchronization with sequential cutting of the switches 70-1 to 70-6 of the first switching unit 68, the switches 74-1 to 74-6 of the second switching unit 72 are sequentially turned on. For example, with the switch 74-1 being turned on to the output line at the leadless terminal 65-1 side that was cut from the output circuit 64-1 by the switch 70-1, a pseudo-output voltage of the pseudo-output unit 78 is supplied. The pseudo-output unit 78 outputs a predetermined pseudo-output voltage for fault diagnosis of the leadless terminals 65-1 to 65-6. As a pseudo-output voltage Vs output from the pseudo-output unit 78, for example, a half of a power supply voltage Vc at the output circuit 64, that is, Vc/2, is output by a resistance-voltage-divider circuit. The measuring unit 80 sequentially measures terminal voltages at the leadless terminals 65-1 and 65-6 with a pseudo-output voltage being applied to the leadless terminal 65-1 by switching of the first switching unit 68 and the second switching unit 72, and then outputs the results to the determining unit 82. The determining unit 82 determines, from the voltages measured by the measuring unit 80, whether the voltage of each of the leadless terminals 65-1 to 65-6 is a normal voltage or an abnormal voltage resulting from an increase in leak current, short-circuit malfunction, or the like caused by a foreign matter or the like attached between the leadless terminals 65-1 to 65-6 and the pattern at the power source side or the pattern at the ground side of the circuit board 12. The determination results obtained by the determining unit 82 as to the leadless terminals 65-1 to 65-6 are reported from the bus interface unit 84 via the bus 30 to the MPU 20. As the bus interface unit 84, the one included in the integrated circuit 10 can be used as it is. Here, determinations by the determining unit 82 provided to the fault diagnosing unit 48 as to whether the measured voltage of each of the leadless terminals 65-1 to 65-6 is a normal voltage or an abnormal voltage differ depending on the type of the input circuits of the external circuits 66-1 to 66-6.

That is, as input circuit portions of the external circuits 66-1 to 66-6, the following three types are present:

(1) A circuit with an input line being connected to a power source line with a pull-up resistor;

(2) A circuit with an input line being connected to ground with a pull-down resistor; and (3) An input circuit in a floating state with neither a pull-up resistor nor a pull-down resistor being connected to an input line. Also, since the external circuits 66-1 to 66-6 are CMOS circuits in most cases, their impedance is sufficiently high, and therefore the output voltages of the leadless terminals 65-1 to 65-6 depend solely on the pull-up resistor, the pull-down resistor, or the floating state.

Figure 3A:
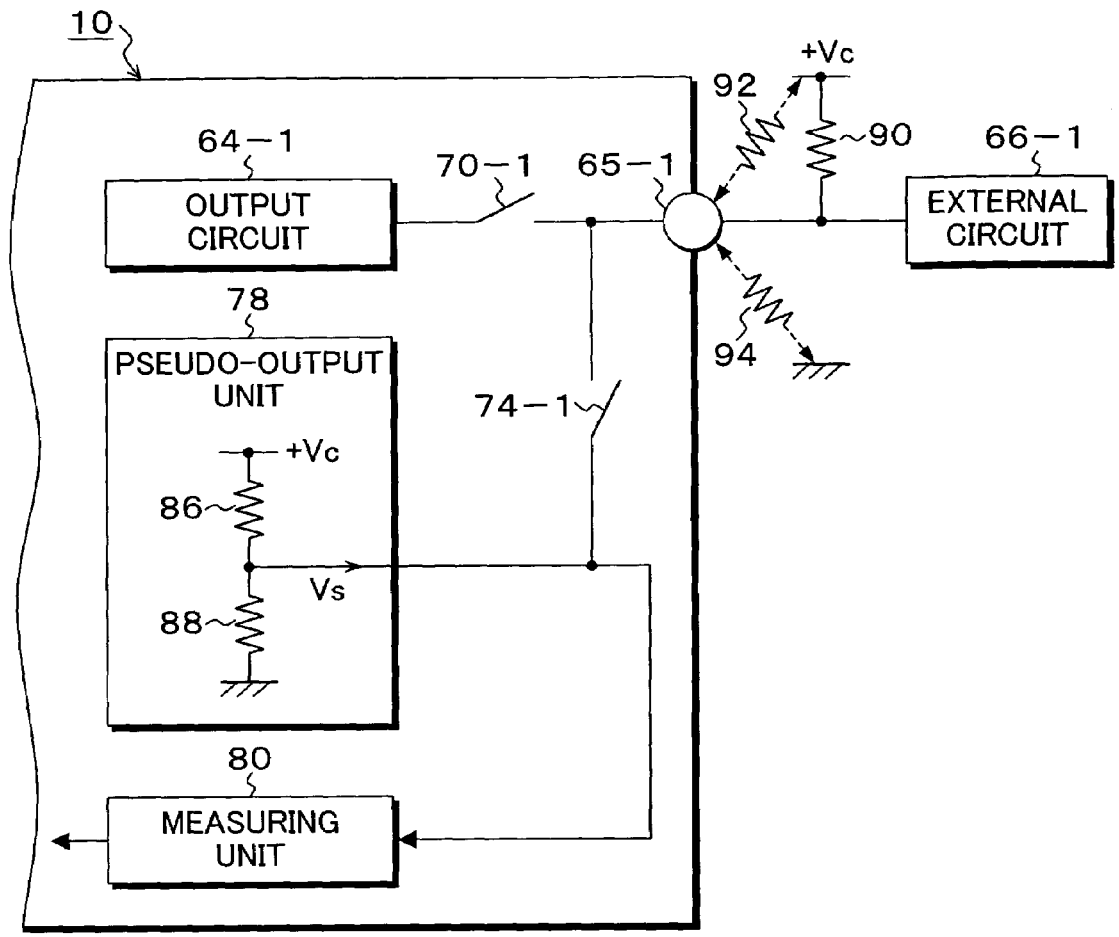
FIGS. 3A to 3C are drawings for describing the fault diagnosing unit and diagnosis principles when a pull-up resistor is connected to an input line of an external circuit.
Figure 3B:
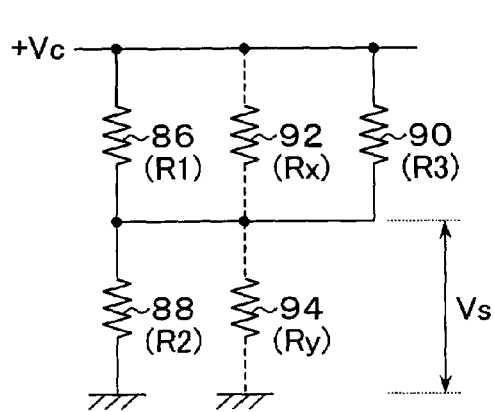
Figure 3C:
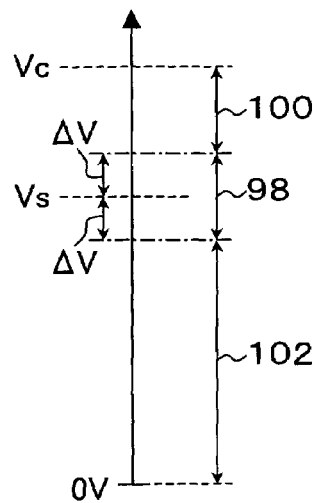

FIGS. 3A to 3C are drawings for describing the diagnosis principles by the fault diagnosing unit and when a pull-up resistor is connected to an input line of an external circuit. FIG. 3A particularly depicts an output system of the output circuit 64-1 of the integrated circuit 10, wherein the external circuit 66-1 connected to the leadless terminal 65-1 is connected to a power source line of the power source voltage Vc with a pull-up resistor 90. Also, the pseudo-output unit 78 provided to the integrated circuit 10 makes a serial connection of resistances 86 and 88 to a portion between the power source line of the power source voltage Vc and ground, and a voltage at its connecting point is taken as a pseudo-output voltage Vs for output. Here, when resistance values of the resistances 86 and 88 are taken as R1 and R2, respectively, R1=R2 is set, for example. Therefore, the pseudo-output voltage Vs with the switch 74-1 being cut is Vs=Vc/2. The leadless terminal 65-1 does not have a foreign matter or the like at the normal time, but may have a foreign matter 92 or a foreign matter 94 attached thereto for some reason. The foreign matter 92 is attached between the leadless terminal 65-1 and Vc of the power source line, and has a resistance component Rx. Furthermore, the foreign matter 94 is attached between the leadless terminal 65-1 and the ground pattern of the external circuit, and similarly has a resistance component Ry. Here, depending on the state of the foreign matters, the resistance components Rx and Ry have varying values and are not constant. In operation, the fault diagnosing unit turns off the switch 70-1 as shown to cut the output circuit 64-1 from the leadless terminal 65-1, and simultaneously turns on the switch 74-1 to apply the pseudo-output voltage Vs from the pseudo-output unit 78 to the leadless terminal 65-1. In this state, the voltage of the leadless terminal 65-1 is measured by the measuring unit 80. FIG. 3B shows, with the fault diagnosing unit being in operation, the resistances 86 and 88 of the pseudo-output unit 78 for the leadless terminal 65-1, the pull-up resistor 90 of the input line of the external circuit 66-1, and further an equivalent circuit by the foreign matters 92 and 94 attached to the leadless terminal 65-1. In FIG. 3B, when no foreign matter is attached to the leadless terminal 65-1, a resistor circuit formed of the resistances 86 and 88 and the pull-up resistor 90 is configured. The voltage Vs of the leadless terminal 65-1 at this time is:

$$Vs = \frac{R2}{(R1 // R3) + R2} Vc \quad \text{[Equation 1]}$$

Here, when R1=R2=R3, Vs becomes as Vs=Vc×2/3, where (R1//R3) represents a parallel resistance value of "1/{(1/R1)+(1/R3)}" of the resistances R1 and R3 in a simple form. FIG. 3C shows a normal voltage Vs with respect to the power supply voltage Vc in the normal state of the leadless terminal 65-1. A range centering on the voltage at the normal time with ±ΔV is denoted as a normal voltage range 98. On the other hand, as to the leadless terminal 65-1 as shown in FIG. 3A, when the foreign matter 92 is attached between the leadless terminal 65-1 and the power supply line of the power voltage Vc, as shown in FIG. 3B, the resistance component Rx is added due to the foreign matter 92. The voltage Vs of the leadless terminal 65-1 in this case is:

$$Vs = \frac{R2}{(R1 // R3 // Rx) + R2} Vc \quad \text{[Equation 2]}$$

and thus the voltage Vs of the leadless terminal 65-1 is increase by the addition of the resistance component Rx due to the foreign matter 92. Therefore, a voltage range exceeding the normal voltage range in FIG. 3C is taken as an abnormal voltage range 100. Also, as shown in FIG. 3A, when the foreign matter 94 is attached between the leadless terminal 65-1 and the external ground pattern, the resistance component Ry is added to FIG. 3B due to the foreign matter 94.

The voltage Vs of the leadless terminal 65-1 in this case is:

$$Vs = \frac{(R2 // Ry)}{(R1 // R3) + (R2 // Ry)} Vc \quad \text{[Equation 3]}$$

In this case, with the resistance component Ry being added due to the foreign matter 94, the voltage of the leadless terminal 65-1 is below the normal voltage range 98 in FIG. 3C. Therefore, a voltage range under the normal voltage range 98 is taken as the abnormal voltage range 102. As such, when the pull-up resistor 90 is connected to the external circuit 66-1, the normal voltage range 98 and the abnormal voltage areas 100 and 102 in FIG. 3C are set in advance as determination criteria in the determining unit 82 of FIGS. 2A and 2B. In comparison with the measured voltage Vs of the leadless terminal obtained through measurement by the measuring unit 80 through a fault testing operation, it is determined whether the voltage is a normal voltage or an abnormal voltage.

Figure 4A:
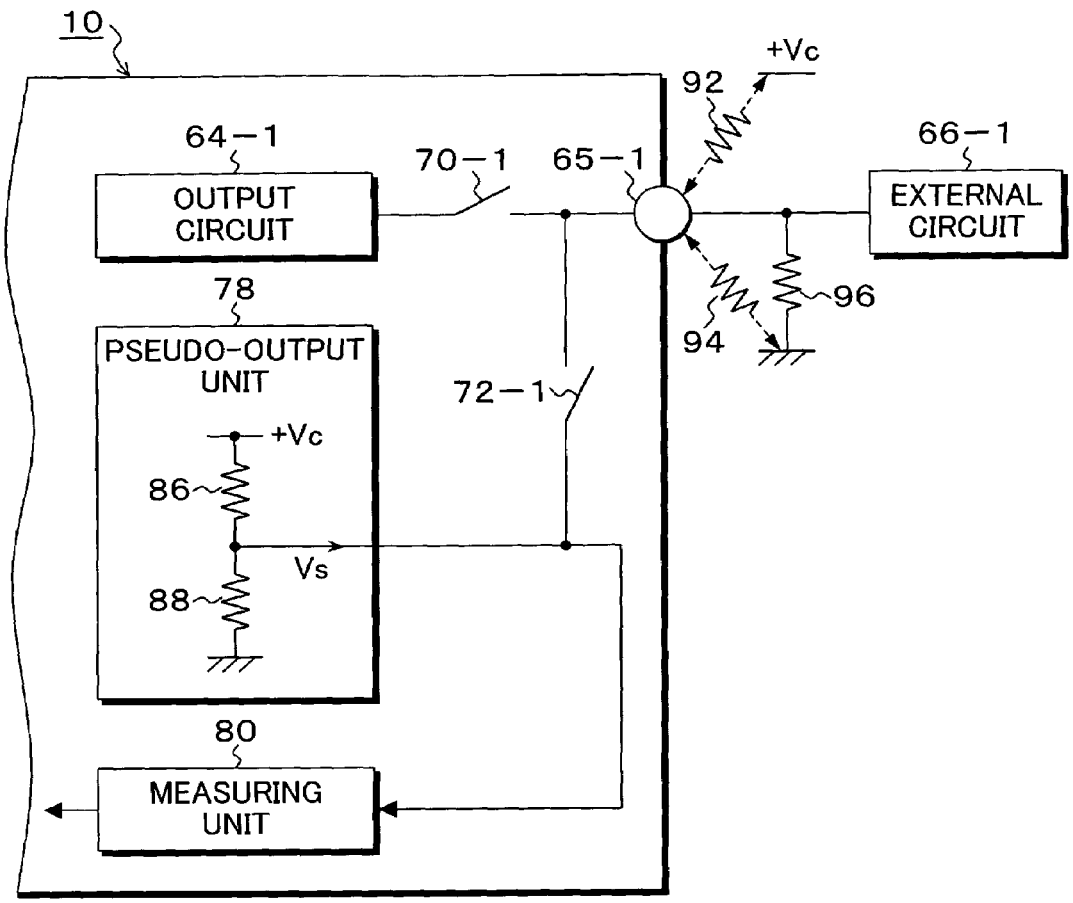
FIGS. 4A to 4C are drawings for describing the fault diagnosing unit and diagnosis principles when a pull-down resistor is connected to the input line of the external circuit.
Figure 4B:
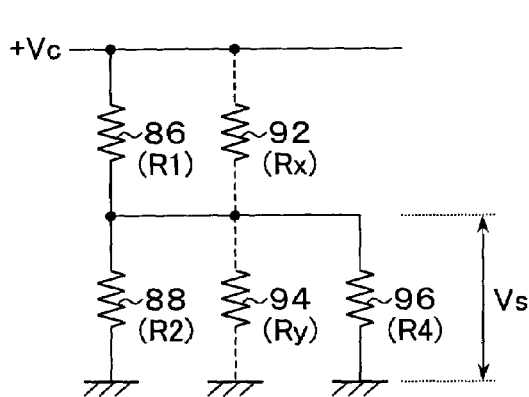
Figure 4C:
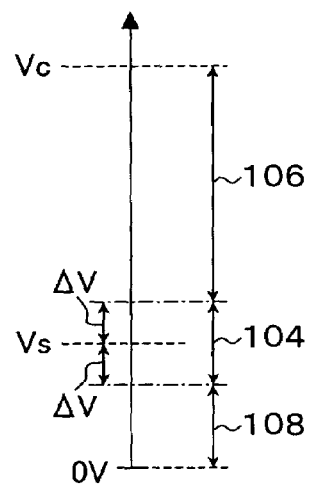

FIGS. 4A to 4C are drawings for describing the fault diagnosing unit and diagnosis principles when a pull-down resistor is connected to the input line of the external circuit. FIG. 4A particularly depicts an output system of the output circuit 64-1, wherein a pull-down resistor 96 is connected to the external circuit 66-1 connected to the leadless terminal 65-1. There is a possibility of existence of the foreign matter 92 attached between the power source line of the power source voltage Vc and the leadless terminal 65-1 or the foreign matter 94 attached between the ground pattern and the leadless terminal 65-1. FIG. 4B shows an equivalent circuit of a resistance connection with respect to the leadless terminal 65-1 of FIG. 4A. At the normal time, the resistances 86, 88, 96 form a resistor circuit network. With the foreign matter 92 or 94 being attached, the corresponding resistance Rx or Ry is added.

Here, at the normal time, the voltage Vs of the leadless terminal 65-1 in FIG. 4B is:

$$Vs = \frac{(R2 // R4)}{R1 + (R2 // R4)} Vc \quad \text{[Equation 4]}$$

When the foreign matter 92 is attached between the power source line and the leadless terminal, the voltage Vs is:

$$Vs = \frac{(R2 // R4)}{(R1 // Rx) + (R2 // R4)} Vc \quad \text{[Equation 5]}$$

and, on the other hand, when the foreign matter 94 is attached between the ground pattern and the leadless terminal, the voltage Vs is:

$$Vs = \frac{(R2 // R4 // Ry)}{R1 + (R2 // R4 // Ry)} Vc \quad \text{[Equation 6]}$$

as the above.

Here, when it is assumed that R1=R2=R4, Vs=Vc/3. The voltage at the time of a fault diagnosis operation for the leadless terminal 65-1 is, as shown in FIG. 4C, in a range of a normal voltage range 104, an abnormal voltage range 106 due to the foreign matter 92 attached between the power source line and the leadless terminal, and an abnormal voltage range 108 due to the foreign matter 94 attached between the ground pattern and the leadless terminal. The normal voltage range 104 and the abnormal voltage ranges 106 and 108 are set as determination criteria in the determining unit 82 of FIGS. 2A and 2B correspondingly to the external circuit 66-1 having the pull-down resistor 96.

Figure 5A:
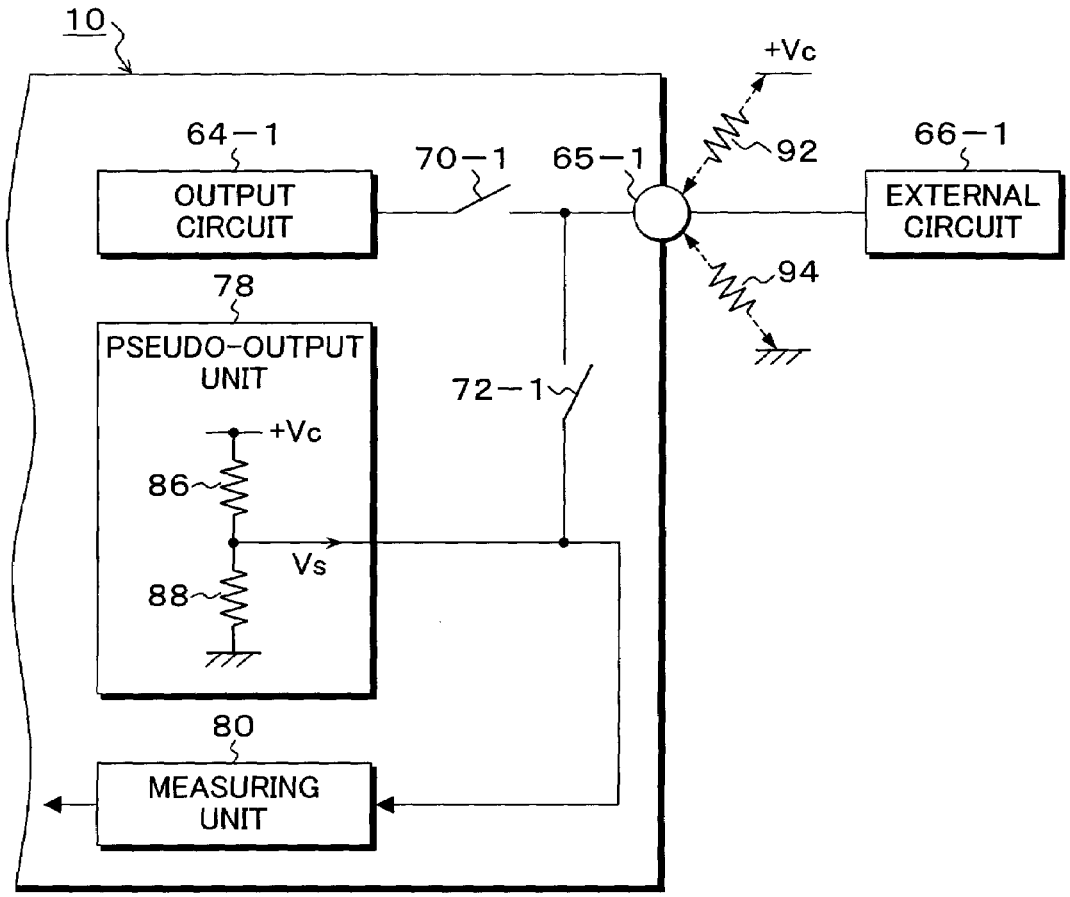
FIGS. 5A to 5C are drawings for describing the fault diagnosing unit and diagnosis principles when the input line of the external circuit is floating.
Figure 5B:
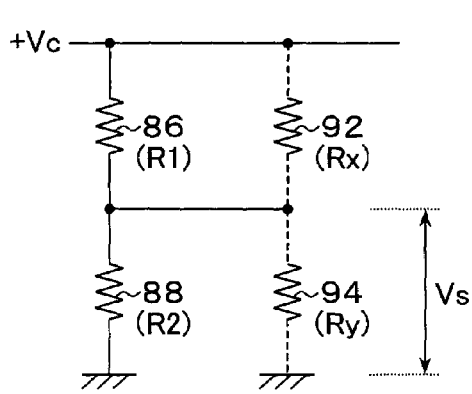
Figure 5C:
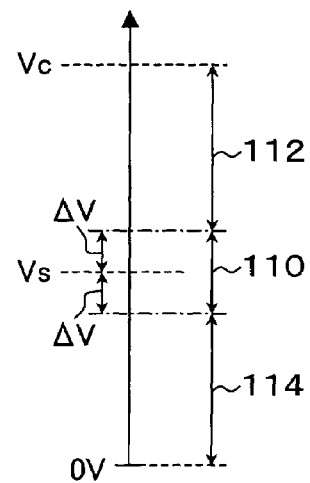

FIGS. 5A to 5C are drawings for describing the fault diagnosing unit and diagnosis principles when the input line of the external circuit is in a floating state. FIG. 5A particularly depicts an output system of the output circuit 64-1, wherein the input line of the external circuit 66-1 has no connection with a pull-up resistor or a pull-down resistor and is in a floating state. As for the leadless terminal 65-1 connected to the input line in a floating state, there is a possibility of attachment of the foreign matter 92 between the power source line and the leadless terminal or the foreign matter 94 between the ground line and the leadless terminal. FIG. 5B shows a resistor circuit network viewed from the leadless terminal 65-1 with respect to the input line of the external circuit in a floating state shown in FIG. 5A. In this case, at the normal time, only the resistances 86 and 88 of the pseudo-output unit 78 are present. To these, the resistance component Rx due to the foreign matter 92 attached between the power source line and the leadless terminal and the resistance component Ry due to the foreign matter 94 attached between the ground line and the leadless terminal are added.

The voltage Vs of the leadless terminal 65-1 in this case is:

$$Vs = \frac{R2}{R1 + R2} Vc \qquad \text{[Equation 7]}$$

When the foreign matter 92 is attached between the power source line and the leadless terminal, the voltage is:

$$Vs = \frac{R2}{(R1 // Rx) + R2} Vc \qquad \text{[Equation 8]}$$

On the other hand, when the foreign matter 94 is attached between the ground line and the leadless terminal, the voltage is:

$$Vs = \frac{(R2 // Ry)}{R1 + (R2 // Ry)} Vc \qquad \text{[Equation 9]}$$

as the above.

FIG. 5C shows the normal voltage range 110 and the abnormal voltage ranges 112 and 114 correspondingly to the equivalent circuit of FIG. 5B. When R1=R2, the normal voltage range 110 is in a range of ±ΔV of Vc/2 obtained through voltage division by the resistance 86 and 88 of the pseudo-output unit 78. When the foreign matter 92 is attached between the power source line and the leadless terminal, the voltage is in the abnormal voltage range 112 exceeding the normal voltage range 110. On the other hand, when the foreign matter 94 is attached between the ground pattern and the leadless terminal, the voltage is in the abnormal voltage range 114 lower than the normal voltage range 110. Values of the normal voltage range 110 and the abnormal voltage ranges 112 and 114 are previously set in the determining unit 82 of FIGS. 2A and 2B as determination criteria correspondingly to the fact that the external circuit is in a floating state.

Figure 6:
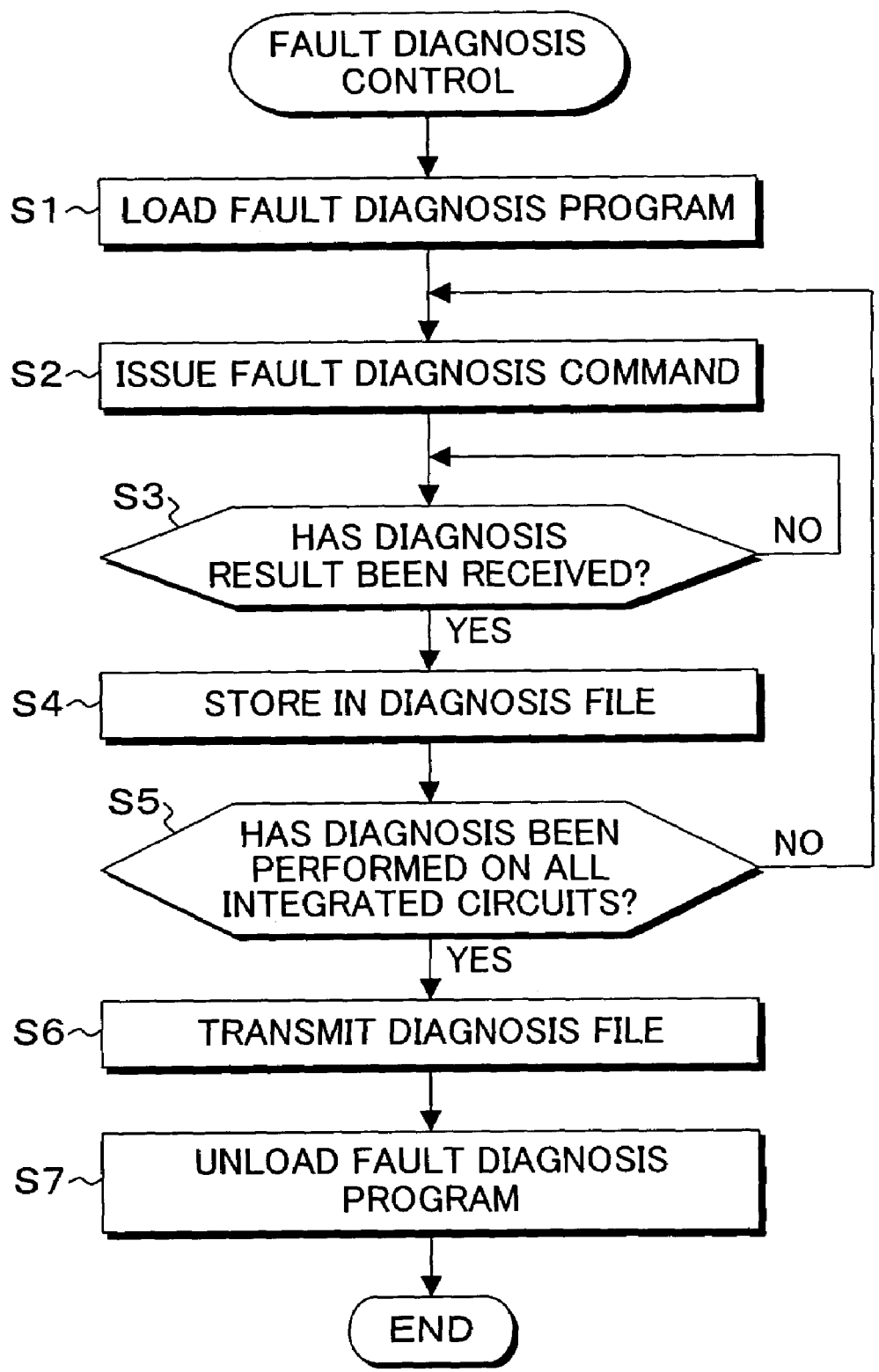
FIG. 6 is a flowchart of fault diagnosis control by an MPU of FIGS. 2A and 2B.

FIG. 6 is a flowchart of fault diagnosis control by the MPU 20 of FIGS. 2A and 2B. In FIG. 6, a fault diagnosis program is loaded from testing equipment in step S1. With the function of the fault diagnosis control unit 46 achieved by this execution of the fault diagnosis program, in step S2, a fault diagnosis command is issued to the integrated circuit 10 including the fault diagnosis function as to the leadless terminal, thereby making an instruction for fault diagnosis. Then in step S3, it is checked whether the diagnosis result has been received from the diagnosis target, and upon receipt of the diagnosis result, the diagnosis result is stored in a diagnosis file in step S4. Then in step S5, it is checked whether diagnosis has been performed on all integrated circuits. As with the integrated circuit 10, a fault diagnosis command is issued in step S2 to another integrated circuit including the fault diagnosing unit 48, thereby causing a self-diagnosis process to be performed, and then the processes in steps S2 to S4 of receiving the diagnosis result and storing the diagnosis result in the diagnosis file are repeated. If it is determined in step S5 that diagnosis has been performed on all integrated circuits, the diagnosis file is transmitted to the testing equipment in step S6. In step S7, the fault diagnosis program is unloaded.

Figure 7:
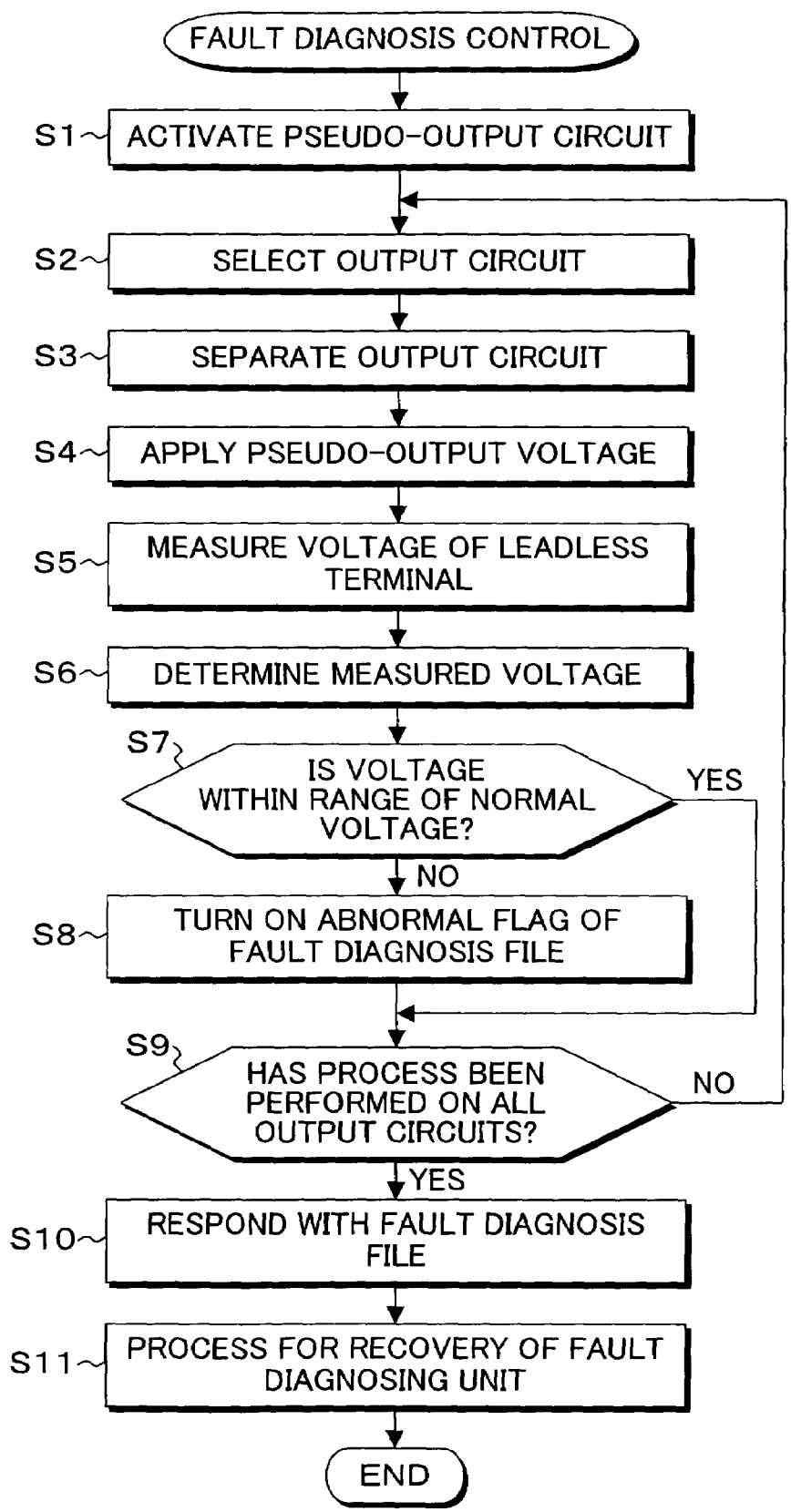
FIG. 7 is a flowchart of a diagnosis process by the fault diagnosing circuit of FIGS. 2A and 2B.

FIG. 7 is a flowchart of a diagnosis process by the fault diagnosing unit of FIGS. 2A and 2B. In FIG. 7, the fault diagnosis process is such that, after the pseudo-output unit 78 is activated in step S1, one of a plurality of output circuits is selected in step S2, and the corresponding switch of the first switching unit 68 is turned off in step S3, thereby cutting the connection of the selected output circuit with the leadless terminal. Then in step S4, the corresponding switch of the second switching unit 72 is turned on, thereby applying a pseudo-output voltage to the leadless terminal. With this state, the voltage of the leadless terminal is measured in step S5 by the measuring unit 80. In step S6, the measured voltage is determined by the determining unit 82. In the determination process, in step S7, if the measured voltage is in the normal voltage range, the procedure goes to step S9. If it is in the abnormal voltage range, an abnormal flag in the self-diagnosis file is turned on in step S8. Then in step S9, it is checked whether the process has been performed on all of the output circuits. If the process has not been completed, the processes from step S2 are repeated. If it is determined in step S9 that the process has been performed on all of the output circuits, after a response with the fault diagnosis file is sent to the MPU 20 in step S10, a recovery process of recovering the fault diagnosing unit to an initial state is performed in step S11, thereby ending a series of the processes.

Figure 8A:
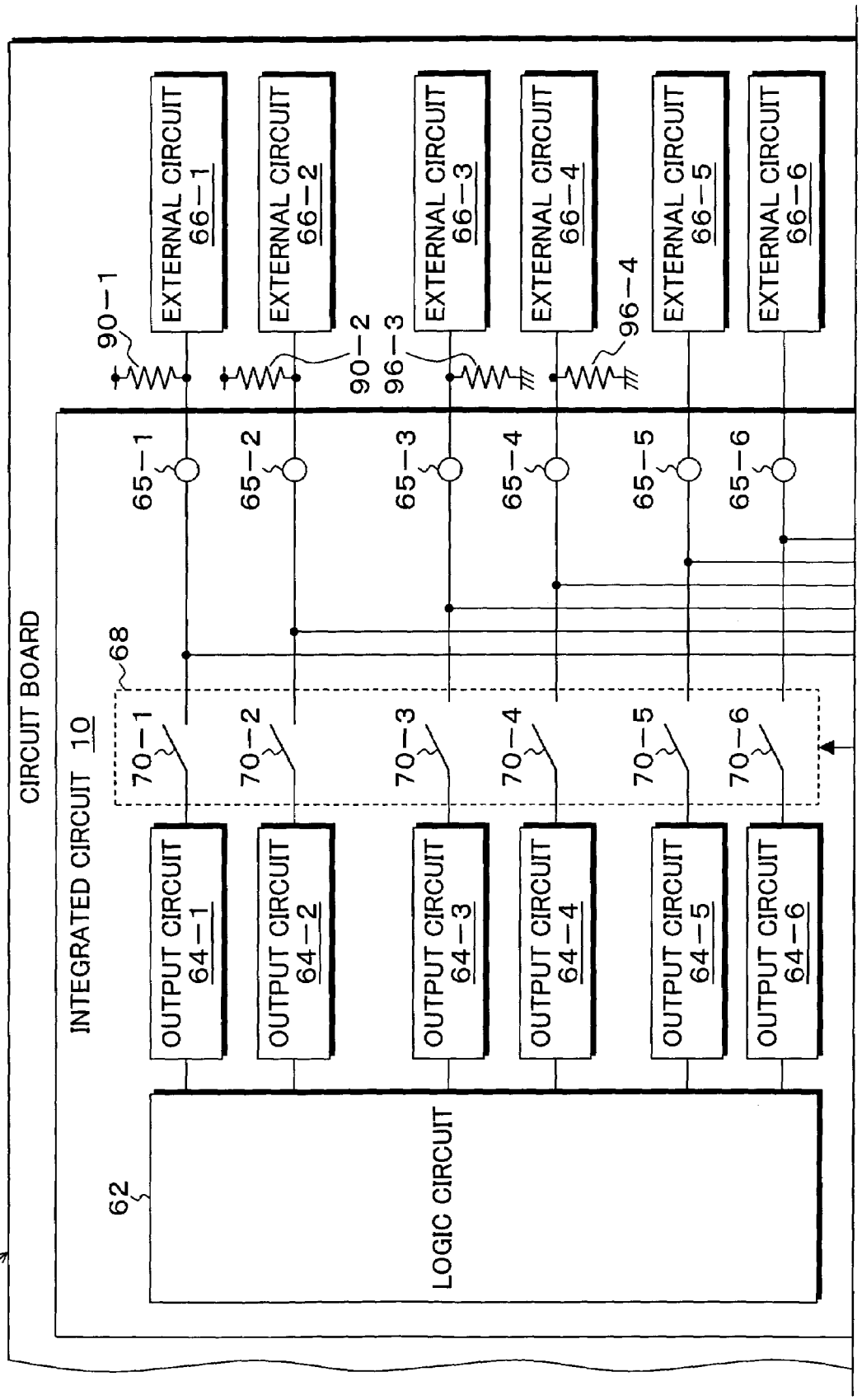
FIGS. 8A and 8B are circuit block diagrams showing a fault diagnosing unit according to another embodiment of the present invention with output circuits divided into groups.
Figure 8B:
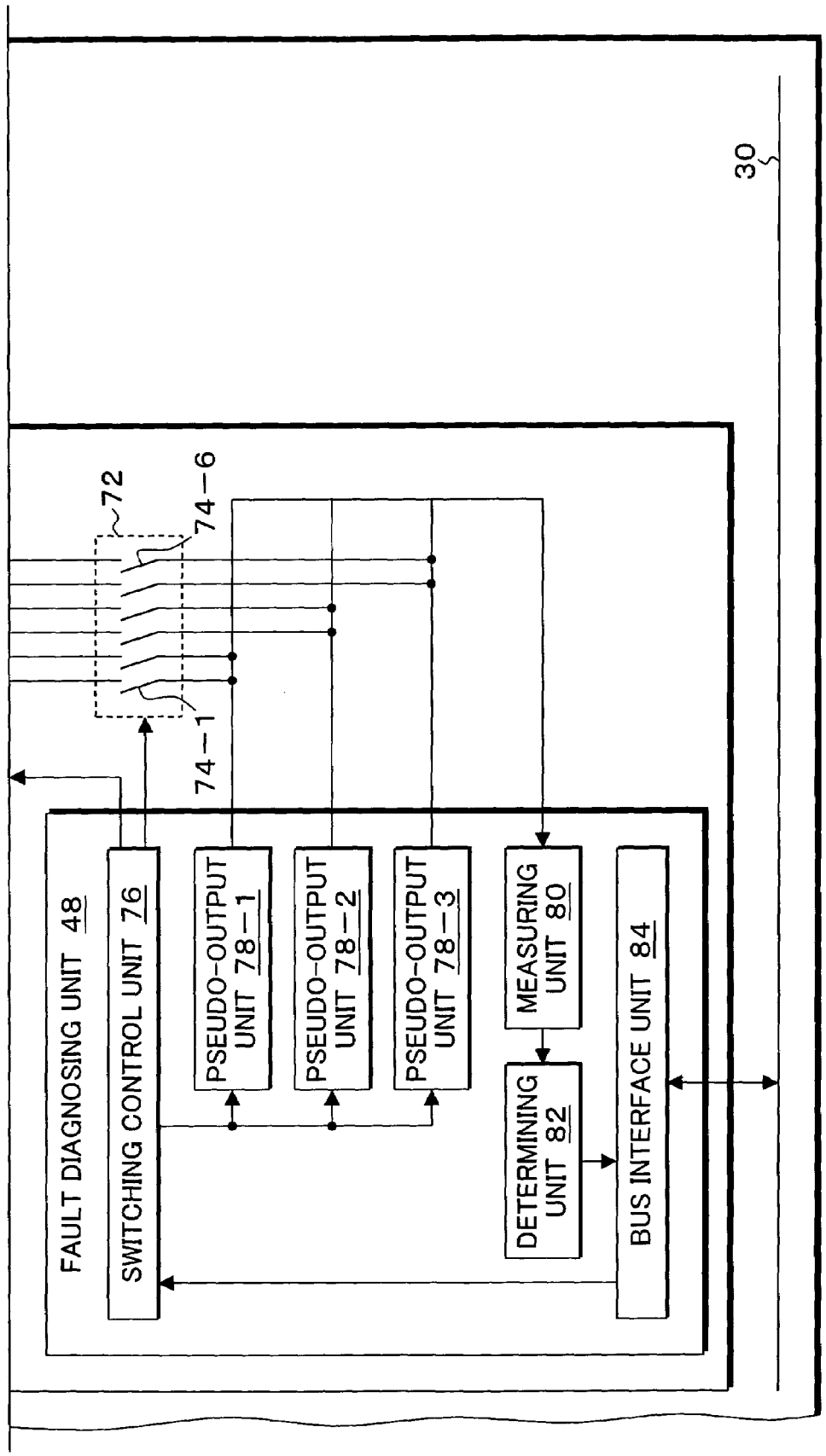

FIGS. 8A and 8B shows another embodiment of the fault diagnosing unit according to another embodiment of the present invention provided on the integrated circuit 10. This embodiment has a feature that, in accordance with pull-up resistors, pull-down resistors, and a floating state of the input lines of the external output circuits, the external circuits are divided into groups, and a pseudo-output voltage unique to each group of the external circuits is supplied. In FIGS. 8A and 8B, the logic circuit 62 of the integrated circuit 10 implemented on the circuit board 12 includes the output circuits 64-1 to 64-6. The external circuits 66-1 to 66-6 on the circuit board 12 that are connected via the leadless terminals 65-1 to 65-6 are classified into a group containing the external circuits 66-1 and 66-2 having pull-up resistors 90-1 and 90-2, respectively, connected to their input lines, a group containing the external circuits 66-3 and 66-4 having pull-down resistors 96-3 and 96-4, respectively, connected to their input lines, and further a group containing the external circuits 66-5 and 66-6 in a floating state without having connected thereto a pull-up resistor or a pull-down resistor. Correspondingly to the grouping of the external circuits 66-1 to 66-6, the fault diagnosing unit 48 provided on the integrated circuit 10 includes pseudo-output units 78-1, 78-2, and 78-3 for the respective groups. The pseudo-output unit 78-1 is provided correspondingly to the group containing of the external circuits 66-1 and 66-2 including the pull-up resistors 90-1 and 90-2, respectively, and its circuit configuration is the one shown in FIG. 3B, for example. In the embodiment of FIGS. 8A and 8B, the resistance values R1 and R2 of the resistances 86 and 88, respectively, of each pseudo-output unit 78 are set so that the normal voltage range 98 shown in FIG. 3C is located at a center position representing a half of the power supply voltage Vc. Also, the pseudo-output unit 78-2 of FIGS. 8A and 8B corresponds to the group containing the external circuits 66-3 and 66-4 having connected thereto the pull-down resistors 96-3 and 96-4, respectively. The pseudo-output unit 78-2 outputs, for example, a divided voltage by a series circuit of the resistances 86 and 88 shown in FIG. 4B. Unlike in FIG. 4C where the normal voltage range 104 is present at a lower voltage side, the resistance values R1 and R2 of the resistances 86 and 88, respectively, are set so that the normal voltage range is located at an approximately center representing a half of the power supply voltage Vc. Furthermore, the pseudo-output unit 78-3 is provided correspondingly to the external circuits 66-5 and 66-6 in a floating state. In this case, as shown in FIG. 5C, the normal voltage range 110 is located at an approximately center representing a half of the power supply voltage Vc. Therefore, as with FIG. 5B, a circuit is formed where the resistance values R1 and R2 of the resistances 86 and 88, respectively, are set as R1=R2. As such, by setting a pseudo-output voltage for each of a pull-up resistor, a pull-down resistor, and a floating state in the input lines of the external circuits, the normal voltage range with respect to the power supply voltage can be set as a half (approximately the center) of the normal voltage range even with different types of the input line of the external device. With this, irrespectively of the pull-up resistor, the pull-down resistor, or the floating state, the same determination criteria can be used for the determination range of the normal voltage and the abnormal voltage in the determination circuit 52, thereby simplifying the determination process.

Figure 9A:
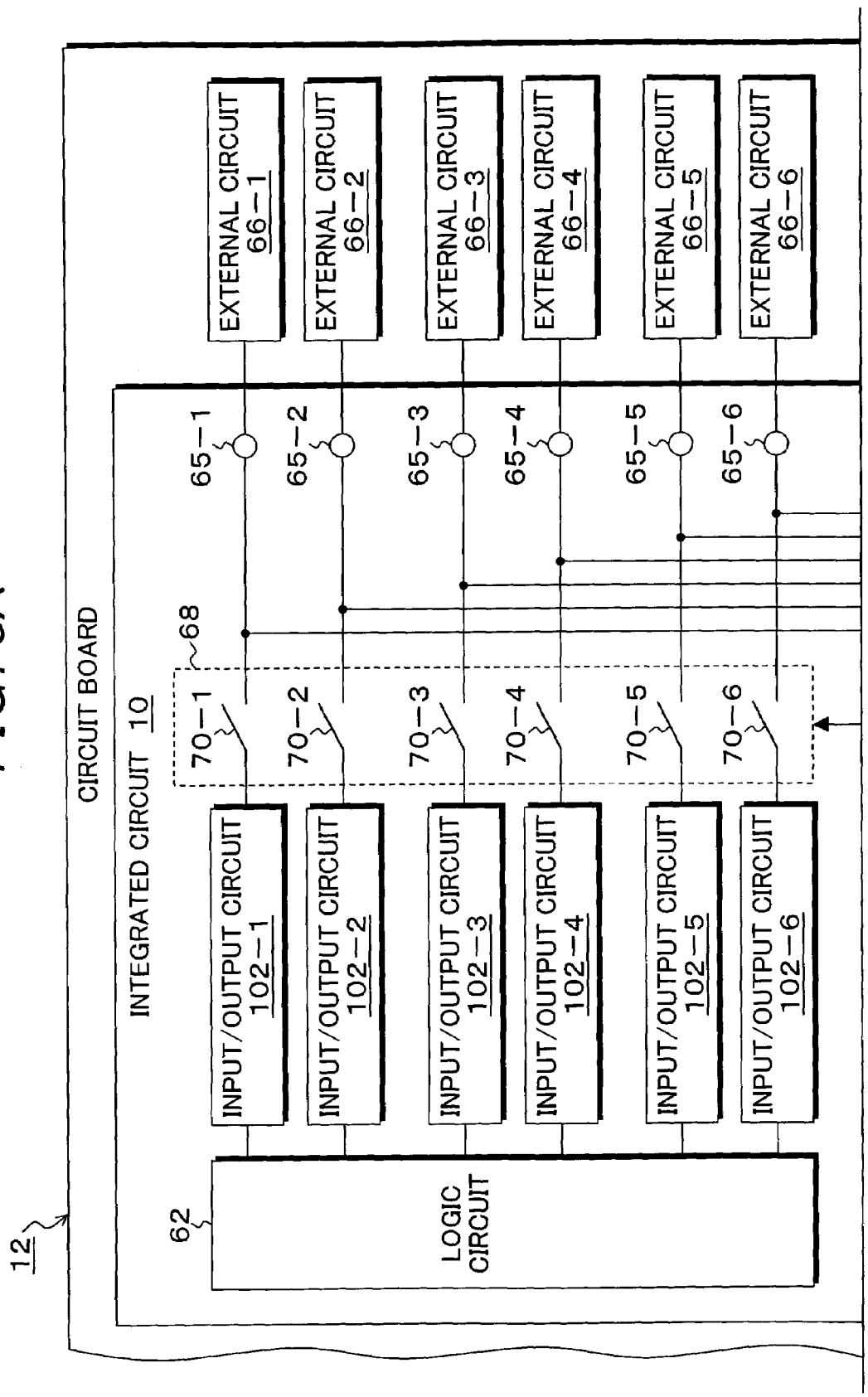

FIGS. 9A and 9B shows still another embodiment of the integrated circuit according to the present invention. In this embodiment, the fault diagnosing unit of the present invention is provided for the leadless terminals connecting input/output lines of an input/output circuit provided to the integrated circuit 10 to the pattern on the circuit board 12. In FIGS. 9A and 9B, the integrated circuit 10 includes input/output circuits 102-1 to 102-6 for the logic circuit 62, which are connected via the leadless terminals 65-1 to 65-6 to external circuits 66-1 to 66-6 on the circuit board 12 each also having an input/output function. Also in this case, as the fault diagnosing unit 48 according to the present invention, the first switching unit 68, the second switching unit 72, the switching control unit 76, the pseudo-output unit 78, the measuring unit 80, the determining unit 82, and the bus interface unit 84 are provided. With this, an abnormal voltage due to a foreign substance attached, by soldering of the leadless terminal 65-1, between the leadless terminal and the power supply line or ground line can be determined through a fault diagnosis operation and then be reported to the outside. Here, in the above embodiment, as the package structure in which the state of soldering of the terminal to the circuit board, with the terminal as being implemented on the circuit board, cannot been seen from the outside, the ball grid array is taken as an example. Other than that, the structure in which the soldering portion is difficult to see from the outside as being implemented includes QFN (Quad Flat Non-Leaded Package), LCC (Leadless Chip Carrier), or the like. The LCC and QFN have a package with a structure in which only an electrode pad is formed without a lead. For an integrated circuit in a package structure having such a leadless terminal, as with the ball grid array, a fault diagnosing unit for the leadless terminal according to the present invention is provided, thereby making it possible to detect an abnormality due to soldering of the leadless terminal as fault diagnosis. Also, devices using a circuit board having implemented thereon the integrated circuit of the present invention include appropriate information processing apparatuses and equipment, for example, magnetic disk apparatus. Furthermore, in the above embodiment, a case where an MPU (processor) is implemented on a circuit board having implemented thereon the integrated circuit of the present invention is taken as an example. Alternatively, the MPU can be incorporated in the integrated circuit. Still further, the present invention includes appropriate modifications without impairing the purpose or advantage of the present invention, and is not restricted by numerical values shown in the above embodiment.

What is claimed is:

1. An integrated circuit comprising:
   an output circuit that outputs a logic signal;
   a leadless terminal connecting an output line of the output circuit and being connected by soldering to a circuit board; and
   a fault diagnosing unit that tests an output voltage of the leadless terminal as being implemented on the circuit board to determine whether the output voltage is a normal voltage or an abnormal voltage;
   wherein the fault diagnosing unit further comprises:
   a pseudo-output unit that applies a predetermined pseudo-output voltage to the leadless terminal;
   a switching unit that cuts a connection of the output circuit to the leadless terminal at the time of fault diagnosis, and supplies the pseudo-output voltage of the pseudo-output unit to the leadless terminal side as being cut;
   a measuring unit that measures a voltage of the leadless terminal in a fault diagnosis state by the switching unit; and
   a determining unit that determines, from the voltage measured by the measuring unit, whether the voltage of the leadless terminal is a normal voltage or an abnormal voltage.

2. The integrated circuit according to claim 1, wherein when a plurality of said output circuits are present, the switching unit sequentially cuts connections of leadless terminals with the plurality of output circuits at the time of fault diagnosis and, in synchronization with the cutting of the leadless terminal, connects an output of the pseudo-output unit to a relevant one of the leadless terminals.

3. The integrated circuit according to claim 1, wherein the switching unit includes a first switching unit that cuts an output of the output circuit from the leadless terminal at the time of the fault diagnosis and a second switching unit that connects the output of the pseudo-output unit to the leadless terminal side cut by the first switching unit.

4. The integrated circuit according to claim 1, wherein the pseudo-output unit outputs a resistance divided voltage generated by a resistance series circuit as the pseudo-output voltage.

5. The integrated circuit according to claim 4, wherein with an external circuit of the circuit board making a pull-up connection of an input line to a power source line via a pull-up resistor, when the measured voltage is in a predetermined voltage range centering on a specific voltage defined by a resistance of the pseudo-output unit and the pull-up resistor, the determining unit determines that the measured voltage is a normal voltage, and when the measured voltage is outside the predetermined voltage range, determines that the measured voltage is an abnormal voltage resulting from a soldering connection of the leadless terminal.

6. The integrated circuit according to claim 4, wherein with an external circuit of the circuit board making a pull-down connection of an input line to a ground via a pull-down resistor, when the measured voltage is in a predetermined voltage range centering on a specific voltage defined by a resistance of the pseudo-output unit and the pull-down resistor, the determining unit determines that the measured voltage is a normal voltage, and when the measured voltage is outside the predetermined voltage range, determines that the measured voltage is an abnormal voltage resulting from a soldering connection of the leadless terminal.

7. The integrated circuit according to claim 4, wherein with an external circuit of the circuit board being in a floating state in which an input line is cut from a power source line and a ground, when the measured voltage is in a predetermined voltage range centering on a specific voltage defined by a divided voltage resistance of the pseudo-output unit, the determining unit determines that the measured voltage is a normal voltage, and when the measured voltage is outside the predetermined voltage range, determines that the measured voltage is an abnormal voltage resulting from a soldering connection of the leadless terminal.

8. A circuit board having implemented thereon an integrated circuit and a circuit external thereto, the circuit board comprising,
  an output circuit that outputs a logic signal;
  a leadless terminal connecting an output line of the output circuit and being connected by soldering to a circuit board; and
  a fault diagnosing unit that tests an output voltage of the leadless terminal as being implemented on the circuit board to determine whether the output voltage is a normal voltage or an abnormal voltage;
  wherein the fault diagnosing unit further comprises:
  a pseudo-output unit that applies a pseudo-set predetermined pseudo-output voltage to the leadless terminal;
  a switching unit that cuts a connection of the output circuit to the leadless terminal at the time of fault diagnosis, and supplies the pseudo-output voltage of the pseudo-output unit to the leadless terminal side as being cut;
  a measuring unit that measures a voltage of the leadless terminal in a fault diagnosis state by the switching unit; and
  a determining unit that determines, from the voltage measured by the measuring unit, whether the voltage of the leadless terminal is a normal voltage or an abnormal voltage.

9. The circuit board according to claim 8, wherein when a plurality of said output circuits are present, the switching unit sequentially cuts connections of leadless terminals with the plurality of output circuits at the time of fault diagnosis and, in synchronization with the cuffing of the leadless terminal, connects an output of the pseudo-output unit to a relevant one of the leadless terminals.

10. The circuit board according to claim 8, wherein the switching unit includes a first switching unit that cuts an output of the output circuit from the leadless terminal at the time of the fault diagnosis and a second switching unit that connects the output of the pseudo-output unit to the leadless terminal side cut by the first switching unit.

11. The circuit board according to claim 8, wherein the pseudo-output unit outputs a resistance divided voltage generated by a resistance series circuit as the pseudo-output voltage.

12. The circuit board according to claim 11, wherein with an external circuit of the circuit board making a pull-up connection of an input line to a power source line via a pull-up resistor, when the measured voltage is in a predetermined voltage range centering on a specific voltage defined by a resistance of the pseudo-output unit and the pull-up resistor, the determining unit determines that the measured voltage is a normal voltage, and when the measured voltage is outside the predetermined voltage range, determines that the measured voltage is an abnormal voltage resulting from a soldering connection of the leadless terminal.

13. The circuit board according to claim 12, wherein with an external circuit of the circuit board making a pull-down connection of an input line to a ground via a pull-down resistor, when the measured voltage is in a predetermined voltage range centering on a specific voltage defined by a resistance of the pseudo-output unit and the pull-down resistor, the determining unit determines that the measured voltage is a normal voltage, and when the measured voltage is outside the predetermined voltage range, determines that the measured voltage is an abnormal voltage resulting from a soldering connection of the leadless terminal.

14. The circuit board according to claim 12,
  wherein with an external circuit of the circuit board being in a floating state in which an input line is cut from a power source line and a ground, when the measured voltage is in a predetermined voltage range centering on a specific voltage defined by a divided voltage resistance of the pseudo-output unit, the determining unit determines that the measured voltage is a normal voltage, and when the measured voltage is outside the predetermined voltage range, determines that the measured voltage is an abnormal voltage resulting from a soldering connection of the leadless terminal.

15. The circuit board according to claim 12,
  wherein the fault diagnosing unit performs fault diagnosis upon receipt of an instruction from a processor incorporated in the integrated circuit or implemented on the circuit board and responds with the diagnosis result.

* * * * *

UNITED STATES PATENT AND TRADEMARK OFFICE
CERTIFICATE OF CORRECTION

| | | |
|---|---|---|
| PATENT NO. | : 7,215,132 B2 | Page 1 of 1 |
| APPLICATION NO. | : 11/212358 | |
| DATED | : May 8, 2007 | |
| INVENTOR(S) | : Yokota | |

It is certified that error appears in the above-identified patent and that said Letters Patent is hereby corrected as shown below:

In the Claims:

Claim 9, col. 14, line 3, delete "cuffing" and insert --cutting--.

Signed and Sealed this

Twenty-fifth Day of September, 2007

JON W. DUDAS
*Director of the United States Patent and Trademark Office*